US006982898B2

(12) United States Patent
Rust

(10) Patent No.: US 6,982,898 B2
(45) Date of Patent: Jan. 3, 2006

(54) MOLECULAR MEMORY INTEGRATED CIRCUIT UTILIZING NON-VIBRATING CANTILEVERS

(75) Inventor: Thomas F. Rust, Oakland, CA (US)

(73) Assignee: Nanochip, Inc., Fremont, CA (US)

(*) Notice: Subject to any disclaimer, the term of this patent is extended or adjusted under 35 U.S.C. 154(b) by 0 days.

(21) Appl. No.: 10/684,883

(22) Filed: Oct. 14, 2003

(65) Prior Publication Data

US 2004/0145848 A1 Jul. 29, 2004

Related U.S. Application Data

(60) Provisional application No. 60/418,616, filed on Oct. 15, 2002, and provisional application No. 60/418,618, filed on Oct. 15, 2002.

(51) Int. Cl.
*G11C 11/00* (2006.01)

(52) U.S. Cl. ...................................... 365/151; 365/114
(58) Field of Classification Search ................. 365/151, 365/114; 369/126
See application file for complete search history.

(56) References Cited

U.S. PATENT DOCUMENTS

| 4,340,953 A | 7/1982 | Iwamura et al. ............ 369/126 |
| 4,575,822 A | 3/1986 | Quate ......................... 365/174 |
| 4,829,507 A | 5/1989 | Kazan et al. ............... 369/126 |

(Continued)

FOREIGN PATENT DOCUMENTS

| EP | 0 788 149 A1 | 6/1997 |
| JP | 3295043 | 12/1991 |
| JP | 3295044 | 12/1991 |
| JP | 4159636 | 6/1992 |
| WO | WO 96/11472 | 4/1996 |
| WO | WO 97/05610 | 2/1997 |
| WO | WO 00/36608 | 6/2000 |
| WO | WO 02/37488 A1 | 5/2002 |

OTHER PUBLICATIONS

Bo Hong, *Exploring the Usage of MEMS-based Storage as Metadata Storage and Disk Cache in Storage Hierarchy*, Storage Systems Research Center, Jack Baskin School of Engineering, University of California at Santa Cruz http://www.cse.ucsc.edu/~hongbo/publications/mems-meta-data.pdf.

Sumio Hosaka, Hajime Koyanagi and Atsushi Kikukawa, Nanometer Recording on Graphite and Si Substrate Using an Atomic Force Microscope in Air, Japan Journal of Applied Physics, vol. 32 (1993) pp. L464–467, Part 2, No. 3B, Mar. 15, 1993, Central Research Laboratory, Hitachi Limited, Kokubunji, Tokyo 185.

(Continued)

*Primary Examiner*—Anh Phung
(74) *Attorney, Agent, or Firm*—Fliesler Meyer LLP

(57) ABSTRACT

Memory devices in accordance with the present invention can comprise a molecular memory integrated circuit including a set of actuators capable of moving one or more platforms. In one embodiment the platforms can include either a memory device or a Molecular Array Read/Write Engine (MARE) with a cantilever system having at least one cantilever tip. When a first platform with a memory device is brought within close proximity of a second platform with a MARE, the actuators can position the cantilever tip to a specific location on the memory device. The tip of the cantilever can perform a number of functions to the memory device, including reading the state of the memory device or changing the state of the memory device. This description is not intended to be a complete description of, or limit the scope of, the invention.

24 Claims, 6 Drawing Sheets

U.S. PATENT DOCUMENTS

| | | | |
|---|---|---|---|
| 4,831,614 A | 5/1989 | Duerig et al. | 369/101 |
| 4,916,002 A | 4/1990 | Carver | 428/139 |
| 4,916,688 A | 4/1990 | Foster et al. | 369/126 |
| 4,943,719 A | 7/1990 | Akamine et al. | 250/306 |
| 4,945,515 A | 7/1990 | Ooumi et al. | 365/174 |
| 4,962,480 A | 10/1990 | Ooumi et al. | 365/151 |
| 4,968,585 A | 11/1990 | Albrecht et al. | 430/320 |
| 4,987,312 A | 1/1991 | Eigler | 250/492.3 |
| 5,038,322 A | 8/1991 | Van Loenen | 365/114 |
| 5,043,578 A | 8/1991 | Guethner et al. | 250/307 |
| 5,051,977 A | 9/1991 | Goldberg | 369/126 |
| 5,091,880 A | 2/1992 | Isono et al. | 365/151 |
| 5,095,479 A | 3/1992 | Harigaya et al. | 369/288 |
| 5,097,443 A | 3/1992 | Kaneko et al. | 365/153 |
| 5,132,934 A * | 7/1992 | Quate et al. | 369/126 |
| 5,144,148 A | 9/1992 | Eigler | 250/492.3 |
| 5,187,367 A | 2/1993 | Miyazaki et al. | 250/306 |
| 5,196,701 A | 3/1993 | Foster et al. | 250/306 |
| 5,216,631 A | 6/1993 | Sliwa, Jr. | 365/174 |
| 5,251,200 A | 10/1993 | Hatanaka et al. | 369/126 |
| 5,260,567 A | 11/1993 | Kuroda et al. | 250/227.19 |
| 5,262,981 A | 11/1993 | Rabe et al. | 365/120 |
| 5,265,046 A | 11/1993 | Fuchs et al. | 365/151 |
| 5,289,455 A | 2/1994 | Kuroda et al. | 369/126 |
| 5,307,311 A | 4/1994 | Sliwa, Jr. | 365/174 |
| 5,323,375 A | 6/1994 | Ihara et al. | 369/126 |
| 5,329,122 A | 7/1994 | Sakai et al. | 250/306 |
| 5,335,197 A | 8/1994 | Kaneko et al. | 365/153 |
| 5,389,475 A | 2/1995 | Yanagisawa et al. | 430/19 |
| 5,412,597 A | 5/1995 | Miyazaki et al. | 365/174 |
| 5,444,191 A * | 8/1995 | Yamamoto et al. | 178/18.01 |
| 5,446,684 A | 8/1995 | Kaneko et al. | 365/46 |
| 5,453,970 A | 9/1995 | Rust et al. | 369/176 |
| 5,471,064 A | 11/1995 | Koyanagi et al. | 250/452.2 |
| 5,471,458 A | 11/1995 | Oguchi et al. | 369/126 |
| 5,537,372 A | 7/1996 | Albrecht et al. | 369/43 |
| 5,557,596 A | 9/1996 | Gibson et al. | 369/101 |
| 5,561,300 A | 10/1996 | Wada et al. | 250/492.2 |
| 5,606,162 A | 2/1997 | Buser et al. | 250/306 |
| 5,615,143 A * | 3/1997 | MacDonald et al. | 365/112 |
| 5,679,952 A | 10/1997 | Lutwyche et al. | 250/306 |
| 5,751,685 A | 5/1998 | Yi | 369/126 |
| 5,778,134 A | 7/1998 | Sakai et al. | 386/46 |
| 5,801,472 A | 9/1998 | Wada et al. | 310/309 |
| 5,804,710 A | 9/1998 | Mamin et al. | 73/105 |
| 5,808,973 A | 9/1998 | Tanaka | 369/14 |
| 5,822,285 A | 10/1998 | Rugar et al. | 369/44.26 |
| 5,835,477 A | 11/1998 | Binnig et al. | 369/126 |
| 5,848,077 A | 12/1998 | Kamae et al. | 371/53 |
| 5,856,967 A | 1/1999 | Mamin et al. | 369/126 |
| 5,929,438 A | 7/1999 | Suzuki et al. | 250/306 |
| 5,935,339 A | 8/1999 | Henderson et al. | 134/1 |
| 5,953,306 A | 9/1999 | Yi | 369/126 |
| 6,001,519 A | 12/1999 | Yang et al. | 430/20 |
| 6,027,951 A | 2/2000 | MacDonald et al. | 438/20 |
| 6,038,916 A | 3/2000 | Cleveland et al. | 73/105 |
| 6,084,849 A | 7/2000 | Durig et al. | 369/126 |
| 6,196,061 B1 | 3/2001 | Adderton et al. | 73/105 |
| 6,249,747 B1 | 6/2001 | Binnig et al. | 369/126 |
| 6,275,410 B1 | 8/2001 | Morford | 365/151 |
| 6,339,217 B1 | 1/2002 | Kley | 250/216 |
| 6,366,340 B1 | 4/2002 | Ishibashi et al. | 355/69 |
| 6,369,400 B1 | 4/2002 | Haeberle et al. | 250/548 |
| 6,507,552 B2 | 1/2003 | Gibson | 369/126 |
| 6,522,566 B2 | 2/2003 | Carter | 365/118 |
| 6,542,400 B2 | 4/2003 | Chen et al. | 365/151 |
| 6,647,766 B2 | 11/2003 | Despont et al. | 73/105 |
| 6,819,588 B2 * | 11/2004 | Baumeister et al. | |
| 2002/0101573 A1 | 8/2002 | Ishibashi et al. | |
| 2002/0110074 A1 | 8/2002 | Gibson | |
| 2002/0135917 A1 | 9/2002 | Davidson | |
| 2003/0007443 A1 | 1/2003 | Nickel | |
| 2003/0081532 A1 | 5/2003 | Gibson | |
| 2003/0185139 A1 | 10/2003 | Ives | |
| 2003/0189200 A1 | 10/2003 | Lee et al. | |

OTHER PUBLICATIONS

Atsushi Kikukawa, Sumio Hosaka, Yukio Honda[1] and Ryo Imura, Phase–Controlled Scanning Force Microscope, Japanese Journal of Applied Physics, vol. 33 (1994) pp. L1286–L1288, Part 2, No. 9A, Sep. 1, 1994, Advanced Research Laboratory, Hitachi Limited, 1–280 Higashi–koigakubo, Kokubunji–shi, Tokyo 185, [1]Central Research Laboratory, Hitachi Limited, 1–280 Kigashi–koigakubo, Kokubunji–shi, Tokyo 185.

William P. King, Daniel A. Fletcher and Y. Sungtaek Ju, Nanometer–Scale Thermal Processing for Advanced Manufacturing (YIP '96), Office of Naval Research Annual Grant Report, First Annual Report: May 1, 1996—Apr. 30, 1997, pp. 1–8.

T. C. Reiley, T.R. Albrecht, D. W. Albrecht, K. Kuroki and M. Aoyagi, A Micro Hard Disk Drive, I.B. M.—Almaden Research Center, I.B.M. Storage System Division, Electrochemical Society Proceeding, vol. 98–20, pp. 10–18.

Seiji Heiki, Yasuo Wada and Tomihiro Hashizume, Correlation Between Tip–Apex Shape and Surface Modification by Scanning Tunneling Microscopy, Journal of Applied Physics, vol. 86, No. 8, pp. 4220–4224.

Michael Brooks, Hole in One, New Scientist, Mar. 27, 1999, pp. 46–48.

H. Jonathon Mamin, Robert P. Ried, Bruce D. Terris and Daniel Rugar, High–Density Data Storage Based on the Atomic Force Microscope, Proceeding of the IEEE, vol. 87, No. 6, Jun. 1999, pp. 1014–1027.

Steven W. Schlosser, John Linwood Griffin, David F. Nagle, and Gregory R. Ganer, Filling the Memory Access Gap: A Case for On–Chip Magnetic Storage, School of Computer Science, Carnegie Mellon University, Nov. 1999.

Steven W. Schlosser, John Linwood Griffin, David F. Nagle and Gregory R. Ganger, Carnegie Mellon University, Designing Computer Systems with MEMS–Based Storage, 9th International Conference on Architectural Support for Programming Languages and Operating Systems, 2000.

S. Hosaka, K. Etoh, A. Kikukawa and H. Koyanagi, Megahertz Silicon Atomic Force Microscopy (AFM) Catilever and High–Speed Readout in AFM–Based Recording, Journal of Vacuum Science Technology, vol. 18, No. 1, Jan./Feb. 2000, pp. 94–99.

Robert P. Ried, Air–Bearing Sliders and Plane–Plane–Concave Tips for Atomic Force Microscope Cantilevers, Journal of Microelectromechanical Systems, vol. 9, No. 1, Mar. 2000, pp. 52–57.

L. Richard Carley, Gregory R. Ganger and David F. Nagle, *Mems–Based Integrated–Circuit Mess–Storage Systems*, Communications of the ACM, vol. 43, No., 11, Nov. 2000, pp. 73–80.

P. Vettiger, M. Despont, U. Drechsler, U. Durig, W. Haberle, M. I. Lutwyche, H.E. Rothuizen, R. Stutz, R. Widmer and G. K. Binnig, The "Millipede"—More than one thousand tips for future AFM data storage, I.B.M. J. Res. Develop., vol. 44, No. 3, May 2000, pp. 323–340.

R. B. Zmood, L. Qin, D. K. Sood, T. Vinay and D. Meyrick, School of Electrical and Computer System Engineering, Royal Melbourne Institute of Technology, Melbourne, Victoria 3000, Australia, Magnetic MEMS Used in Smart Structures Which Exploit Magnetic Materials Properties, Smart Structures and Devices, Proceeding of the SPIE, vol. 4235, 2001, pp. 173–187.

Michael Gross, Small is Great!, New Scientist, Jul. 14, 2001, pp. 1–4.

G. Cherubini, T. Antonakopoulos, P. Bachtold, G. K. Binnig, M. Despont, U. Drechsler, A. Dholakia, U. Durig, E. Eleftheriou, B. Gotsmann, W. Haberle, M. A. Lantz, T. Loeliger, H. Pozidis, H. E. Rothuizen, R. Stutz and P. Vettiger, I.B.M. Research, Zurich Research Laboratory, The Millipede, a Very Dense, Highly Parallel Scanning–Probe Data–Storage System, ESSCIRC 2002, pp. 121–125.

E. Eleftheriou, G. Cherubini, H. Pozidis, H. E. Rothuizen and P. Vettiger, Millipede—a MEMS–Based Scanning–Probe Data–Storage System, APMRC 2002, pp. 1–8.

Satoshi Kawamura, Electronics Device Division, Hitachi Maxell, Limited, Coil on Chip RFID System by Super EF2 Technology, Nippon Oyo Jiki Gakkai Kenkyukai Shiryo, vol. 123, pp. 21–25.

Molecular Chip Patent, Poptronics, vol. 3, No. 5, May 2002, pp. 11–12.

Kenneth J. Korane, A King–Size Future for Nanosize Machines, Machine Design vol. 74, No. 18, Sep. 19, 2002, pp. 88–94.

Peter Vettiger and Gerd Binnig, The Nanodrive Project: Inventing a Nanotechnology Device for Mass Production and Consumer Use is Trickier than it Sounds, Scientific American, vol. 288, No. 1, 2002, pp. 47–53.

Mustafa Uysal, Arif Merchant, Guillermo A. Alvarez, Hewlett Packard Laboratories, Using MEMs–Based Storage in Disk Arrays, Proceedings of FAST '03: $2^{nd}$ USENIX Conference on File and Storage Technologies, USENIX Association, pp. 89–101.

Kiyoshi, T., et al., "Switching and memory phenomenon in Langmuir–Blodgett film using a scanning tunneling microscope," Canon, Inc., IEIC Technical Report (1994), vol. 93, No. 524 (OME93 54–59), pp. 7012, Fig. 6, Ref. 15.

Kiyoshi T. et al., "Application and Progress in the Scanning Probe Microscopy, High Density Information Storage Using Langmuir–Blodgett Film and Atomic Force Microscopy," Canon, Inc., Journal of the Surface Science Society of Japan (1997), vol. 18, No. 4, pp. 213–218, Fig. 7, Ref. 14.

Kado, H. and Tohda, T., "Nanometer–scale recording on chalcogenide films with an atomic force microscope," Appl. Phys./ Lett., vol. 66, No. 22, May 29, 1995, pp. 2961–2962.

Yano, K., et al., "Nanometer scale conductance change in a Langmuir–Blodgett film with the atomic force microscope," Appl. Phys. Lett., vol. 68, vol. 2, Jan. 8, 1996, pp. 188–190.

Yano, K. and Ikeda, T., "Stable bit formation in polyimide Langmuir–Blodgett film using an atomic force microscope," Appl. Phys. Lett., vol. 80, vol. 6, Feb. 11, 2002, pp. 1067–1069.

Barrett, R.C. and Quate, C.F., "Large–scale charge storage by scanning capacitance microscopy," Ultramicroscopy 42–44 (1992) pp. 262–267.

Gardner, R., "AFM Fabricates a Tiny Transistor," Science, vol. 266, Oct. 28, 1994, p. 543.

Hagan, H.P., et al., "Temporal behavior of nanofeatures on Au," Ultramicroscopy, 42–44 (1992), pp. 587–593.

Majumdar, A., et al., "Nanometer–scale lithography using the atomic force microscope," Appl. Phys. Lett., vol. 61, No. 19, Nov. 9, 1992, pp. 2293–2295.

Mamin, H.J. and Ruger, D., "Thermomechanical writing with an atomic force microscopy tip," App. Phys. Lett., vol. 61, No. 8, Aug. 24, 1992, pp. 1003–1005.

Mamin, H.J., et al., "High Density data storage using proximal probe techniques," The IBM Journal of Research and Development, vol. 39, No. 6, Nov. 1995, pp. 681–699.

Manalis, S., et al., "Submicron studies of recording media using thin–film magnetic scanning probes," Applied Physics Letters, vol. 66, No. 19, May 8, 1995, pp. 2585–2587.

Terris, B.D., et al., "Atomic force microscope–base data storage: track servo and wear study," Applied Physics A vol. 66, pp. S809–S813 (1998), (IBM Almaden Research Center, presented STM 97).

Uesugi, K. and Yao, T., "Nanometer–scale fabrication on graphite surfaces by scanning tunneling microscopy," Ultramicroscopy, 42–44 (1992), pp. 1443–1445.

PCT Written Opinion mailed Dec. 18, 2000, International Application No. PCT/US99/30326, filed Dec. 20, 1999.

T.C. Shen et al; Ion irradiation effects on graphite with the scanning tunneling microscope; J.V.Sci. Technol. B9(2), Mar./Apr. 1991; pp. 1376–1379.

U. Staufer et al; Tailoring nanostructures with a scanning tunneling microscope; J.Vac.Sci. Technol. B9(2), Mar./Apr. 1991; pp. 1389–1393.

H.J. Mamin; Gold deposition from a scanning tunneling microscope tip;, et al.; J.Vac.Sci. Technol B9(2), Mar./Apr. 1991; pp. 1398–1402.

J.A. Dagata, et al. Pattern generation on semiconductor surfaces by a scanning tunneling microscope operating in air;; J.Vac.Sci. Technol. B9(2), Mar./Apr. 1991; pp. 1384–1388.

T.R. Albrecht, et al. Nanometer–scale hole formation on graphite using a scanning tunneling microscope;; Appl.Phys.Lett., vol. 55, No. 17, Oct. 23, 1989; pp. 1727–1729.

M.Aono; Has Japan Begun to Move Toward Atomic Level Material Processing?; Science, vol. 258; Oct. 23, 1992.

* cited by examiner

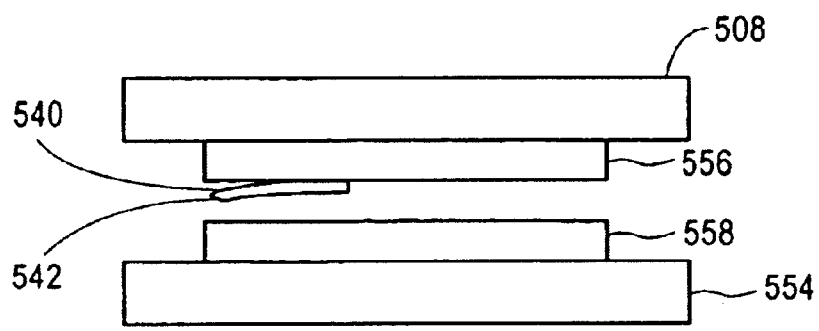
FIG. 5A
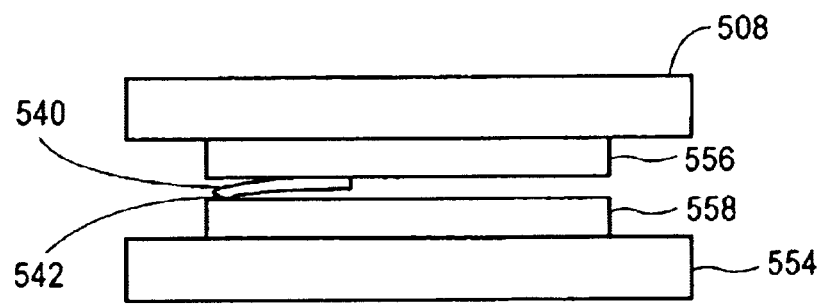
FIG. 5B
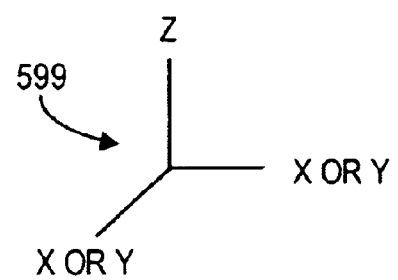

US 6,982,898 B2

MOLECULAR MEMORY INTEGRATED CIRCUIT UTILIZING NON-VIBRATING CANTILEVERS

PRIORITY CLAIM

This application claims priority to the following U.S. Provisional Patent Applications:

U.S. Provisional Patent Application No. 60/418,616 entitled "Molecular Memory Integrated Circuit Utilizing Non-Vibrating Cantilevers," filed Oct. 15, 2002.

U.S. Provisional Patent Application No. 60/418,618 entitled "Molecular Memory Integrated Circuit," filed Oct. 15, 2002.

CROSS-REFERENCE TO RELATED PATENT APPLICATIONS

This application incorporates by reference all of the following co-pending applications:

U.S. patent application Ser. No. 10/684,661, entitled-"Atomic Probes and Media for High Density Data Storage," filed Oct. 14, 2003;

U.S. patent application Ser. No. 10/684,760, entitled-"Fault Tolerant Micro-Electro Mechanical Actuators," filed Oct. 14, 2003;

U.S. patent application Ser. No. 10/685,045, entitled-"Phase Change Media for High Density Data Storage," filed Oct. 14, 2003;

U.S. Provisional Patent Application No. 60/418,923 entitled "Atomic Probes and Media for High Density Data Storage," filed Oct. 15, 2002;

U.S. Provisional Patent Application No. 60/418,612 entitled "Fault Tolerant Micro-Electro Mechanical Actuators," filed Oct. 15, 2002; and U.S. Provisional Patent Application No. 60/418,619 entitled "Phase Change Media for High Density Data Storage," filed Oct. 15, 2002.

COPYRIGHT NOTICE

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

BACKGROUND OF THE INVENTION

1. Field of the Invention

This invention relates to memory on data storage devices and in particular in molecular memory integrated circuits. More particularly, the invention relates to molecular memory integrated circuits for use in micro-electro mechanical systems (MEMS).

2. Description of the Related Art

Current generation computer systems use separately manufactured integrated circuits and components assembled on or connected with system boards. Non-volatile data storage is one of the most performance critical components in a computer system. Current systems suffer from data storage technology incapable of matching the performance of other system components, such as volatile memory and microprocessors. Next generation systems will require improved performance from data storage devices.

Nearly every personal computer and server in use today contains one or more hard disk drives for permanently storing frequently accessed data. Every mainframe and supercomputer is connected to hundreds of hard disk drives. Consumer electronic goods ranging from camcorders to TiVo® use hard disk drives. While hard disk drives store large amounts of data, they consume a great deal of power, require long access times, and require "spin-up" time on power-up.

FLASH memory is a more readily accessible form of data storage and a solid-state solution to the lag time and high power consumption problems inherent in hard disk drives. Like hard disk drives, FLASH memory can store data non-volatilely, but the cost per megabyte is dramatically higher than the cost per megabyte of an equivalent amount of space on a hard disk drive, and is therefore sparingly used.

Current solutions for data storage cannot meet the demands of current technology, and are inadequate and impractical for use in next generation systems, such as MEMS. Consequently, it would be desirable to have an integrated circuit that stores data non-volatilely, that can be accessed instantaneously on power-up, that has relatively short access times for retrieving data, that consumes a fraction of the power consumed by a hard disk drive, and that can be manufactured relatively cheaply. Such an integrated circuit would increase performance and eliminate wait time for power-up in current computer systems, increase the memory capacity of portable electronics without a proportional increase in cost and battery requirements, and enable memory storage for next generation systems such as MEMS.

SUMMARY OF THE INVENTION

A molecular memory integrated circuit includes a set of actuators capable of moving a platform. One embodiment in accordance with the present invention includes a plurality of actuators and platforms. The platform can contain either a memory device or a Molecular Array Read/Write Engine (MARE) with a cantilever system, which includes a cantilever tip. When a first platform with a memory device is brought within close proximity of a second platform with a MARE, the actuators can position the cantilever tip to a specific location on the memory device. The tip of the cantilever can perform a number of functions to the memory device, including reading the state of the memory device or changing the state of the memory device.

BRIEF DESCRIPTION OF THE DRAWINGS

Further details of the present invention are explained with the help of the attached drawings in which:

FIG. 5a is a schematical representation of an embodiment of the invention with two platforms, one above the other, where the top platform holds a MARE with a cantilever system and the bottom platform holds a memory device.

FIG. 5b is the schematical representation of FIG. 5a with a tip of a cantilever on a platform holding a MARE making contact with a memory device that is held by a second platform.

DETAILED DESCRIPTION OF THE DRAWINGS

Figure 1:
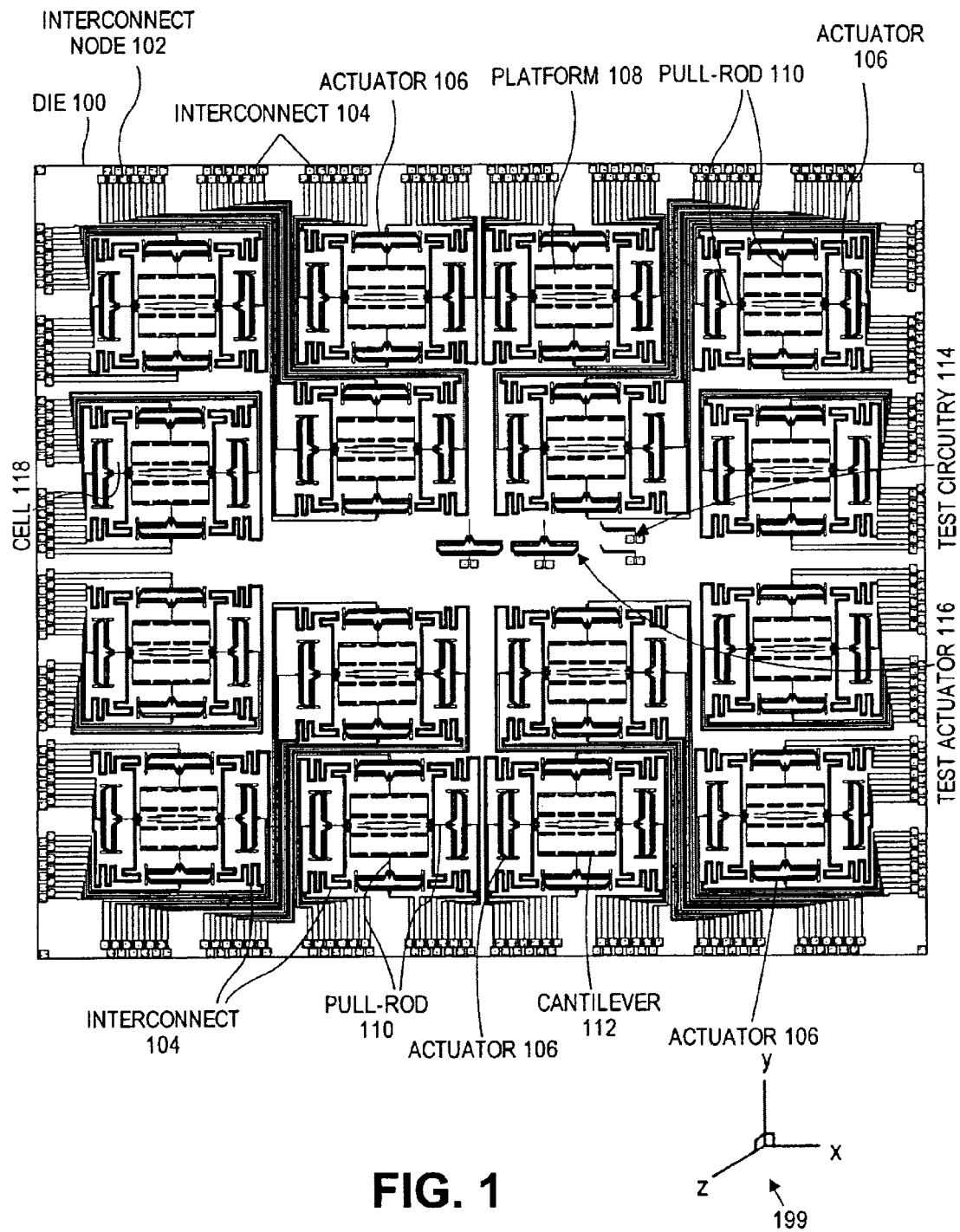
FIG. 1 is a die of an embodiment of the invention that includes a number of cells where each cell further includes an interconnect, an actuator, a pull-rod, and a platform.

Referring to FIG. 1, die 100 is a device that includes sixteen cells 118 as well as many interconnect nodes 102 and many interconnects 104. Each cell 118 includes four actuators 106, four pull-rods 110, a platform 108, and sixteen cantilevers 112. The interconnect node 102 can be coupled with interconnect 104, which in turn is coupled with at least one of the cells 118. Interconnect 104 is also connected with various structures on the individual cells 118. For instance, an interconnect 104 is connected with the platform 108. Another interconnect 104 is connected with cantilever 112. Yet another interconnect is connected with actuator 106. Actuator 106, however, is also connected with pull-rod 110. Pull-rod 110 is also connected with platform 108.

Interconnect 104 can be made from any number of conductive materials. For instance, interconnect 104 could be made from aluminum or copper. Yet, as discussed below, the material chosen for interconnect 104 should have a higher coefficient of expansion than the material chosen for the arms of actuator 106.

Interconnect nodes 102 provide access to the die 100 from sources outside of the die 100, and interconnects 104 provide the pathway for outside sources to communicate with individual cells 118 and the components contained on such cells 118. For instance, sense and control signals can be passed to and read from actuator 106 to determine its relative position from a neutral state. Different signals can be sent to a cantilever 112 to determine the position of cantilever 112 and/or direct the cantilever 112 to read and/or write data to a memory device. Also, the position of platform 108 can also be detected by devices not included on die 100 through signals passed through interconnect node 102 and interconnect 104. Many other signals and readings can be made through interconnect node 102 and interconnect 104 as desired by the design of the die 100, the design of the system incorporating die 100, and other design goals.

In addition to sensing the location of platform 108 and actuators 106 through interconnect node 102 and interconnect 104 on die 100, control signals can be passed through interconnect node 102 and interconnect 104 to direct the actuators 106 to perform some action. For instance, a stimulus can be sent by an outside device directing a particular actuator 106 to actuate, moving only one platform 108 along either the X-axis or Y-axis as defined by reference 119. A control signal could also be directed to one or more actuators 106 at the same time directing multiple platforms 108 to move in different directions along the X-axis, different directions along the Y-axis, in different directions in both the X-axis and Y-axis, or in the same direction as defined by reference 199. The sixteen cells 118 on die 100 can all be controlled simultaneously, individually, or they can be multiplexed. If cells 118 are multiplexed, then additional multiplexing circuitry is required.

Any of the structures can be multiplexed through the use of multiplex diodes, either on the device or external to the device. In addition, multiplexing can be accomplished through the use of transmission gates or other switching components such as simple MOSFETs.

The ability of the devices to operate multiple cells simultaneously and asynchronously is an advantage over previous art. Multiplexing is an advantage in server applications, for example, where multiple simultaneous accesses can be required at different memory locations within one block of memory. The smaller cell sizes, typically 32 Mbytes versus a typical hard disk drive size of 20 Gbytes and above, and the ability to access any of these small blocks simultaneously with any other, provide a typically 1000× granularity improvement over the use of hard disk drives in server applications. In addition, these devices exhibit access times typically 10× faster than hard disk drives. A typical access time is 500 $\mu$sec for these devices.

Another advantage of the multiple small storage cells or platforms is that the physical size of the media and head platforms is reduced greatly from larger platform implementations (such as described by IBM in their Millipede effort). The smaller platforms have much less thermal expansion than larger platforms. Also, thermal oxides or glass can be used for both the small media and head platforms further reducing thermal expansion or thermal mismatch problems, especially when compared with using silicon as a platform substrate, which has about 10× the thermal expansion coefficient of glass. The multiple small platforms using glass type substrates allow the invention to operate over industrial temperature ranges without thermal compensation (heater or cooler). For example, where data is written to the media platforms in tracks, drift in alignment between the cantilevers 112 and tracks caused by thermal expansion can be a fraction of the track spacing of 20–25 nm (for example) across industrial temperature ranges. Because of low thermal expansion, cantilevers 112 can remain aligned with previously written tracks over a range of operating temperatures.

In addition the multiple cell access capability introduces performance advantages when used as cache memory in a computing environment. Cache memory can sit between the main memory and the collection of hard disk drives in a computing environment. Cache memory provides the ability to start frequently accessed information stored on the hard disk drives, with the ability to transfer information to main memory much faster than the hard disk drives themselves. The non-volatile nature of cache memory enables systems to power-down and power-up the computing environment much faster than systems using hard disk drives but not cache memory, and cache memory is much less expensive in cost per bit than FLASH memory. Use of cache memory has major advantages, particularly for portable applications where power savings are critical. Devices utilizing cache memory also inherently require less power than other devices, because the actuators require much less power than hard disk drives and can be powered up and down nearly instantaneously, with only the access time as the latency for powering up. Further, it is advantageous for cache memory to have a high data transfer rate to operate between the main memory (e.g. DRAM) and the hard disk drive. Multiple platforms operating in parallel can have an extremely high data rate. For example, sixteen platforms operating in parallel can have greater than eighty megabytes per second read and write transfer rate.

As shown in FIG. 1, cells 118 do not require multiplexing and, therefore, do not contain any multiplexing circuitry.

In addition to cells 118, die 100 can also include any number of test structures. For instance, test circuitry 114 provides the ability to ensure that the manufacturing process for the actuator arms was performed correctly. A test signal can be applied to test circuitry 114 and a reading/measurement taken of the expansion rates of the arms of actuator 106, without potentially damaging any of interconnect nodes 102. Likewise, a test signal can be applied to test actuator 116 and a reading/measurement taken to determine the maximum force that test actuator 116 can apply to a pull-rod 110. Other data can be collected as well, such as the reliability of the manufacturing process, testing for potential reliability of die 100, determining the stress limits of test actuator 116 or the current requirements in order to induce test actuator 116 to move. Any number of different tests can be designed for test circuitry 114 and test actuator 116 beyond those identified here. Also, other test structures besides test circuitry 114 and test actuators 116 can be included on die 100.

While die 100 includes an array of four by four (4×4) cells 118, many other alternate designs could also be fabricated for die 100. For instance, a single row of sixteen cells 118 could be manufactured and identified as die 100. Also, die 100 could contain as few as a single cell 118 or as many cell 118 as the manufacturing process permits on a single wafer. As semi-conductor manufacturing processes change so that greater die densities and larger wafers can be made, a greater number of cells 118 can be included on a single die 100.

Additionally, while cells 118 in die 100 include platforms 108 with cantilevers 112, cells 118 in die 100 could also be made that have platforms 108 that include memory devices. Furthermore, die 100 could include a first group of cells 118 with platforms 108 that include cantilevers 112 and a second group of cells 118 with platforms 108 that include memory devices.

Figure 2:
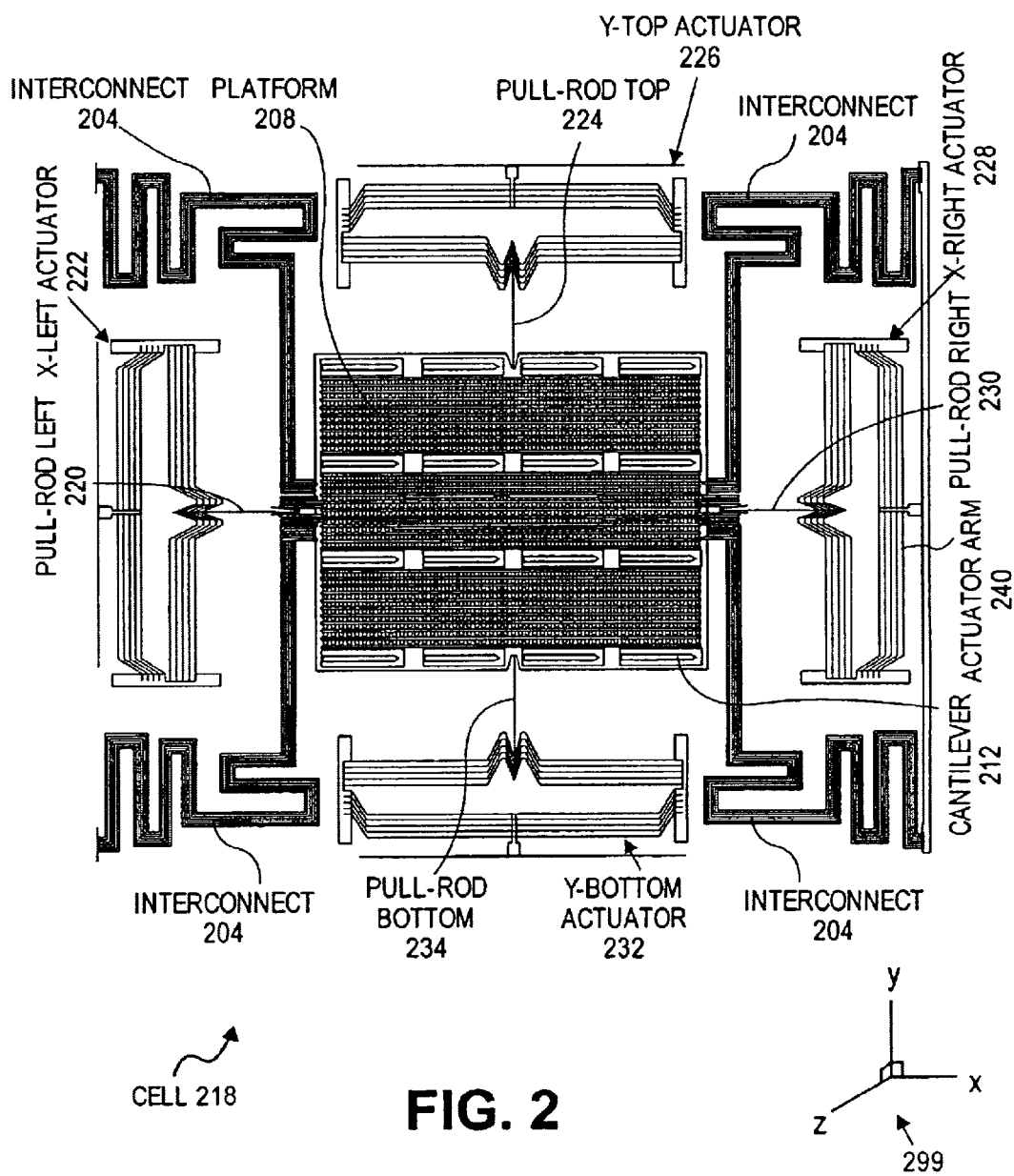
FIG. 2 is a cell of the embodiment of the invention of FIG. 1 that includes a MARE.

FIG. 2 is a cell 218, which is an extract from cell 118 from FIG. 1 where cell 118 includes a Molecular Array Read/Write Engine (MARE). X-left actuator 222 is coupled with pull-rod left 220, which is in turn coupled with platform 208. Y-top actuator 226 is coupled with pull-rod top 224, which is in turn coupled with platform 208. X-right actuator 228 is coupled with pull-rod right 230, which is in turn coupled with platform 208. Y-bottom actuator 232 is coupled with pull-rod bottom 234, which is in turn coupled with platform 208. Interconnect 204 is coupled with platform 208. While not shown in complete detail, but following FIG. 1, interconnect 204 is also coupled with X-left actuator 222, Y-top actuator 226, X-right actuator 228 and Y-bottom actuator 232. Furthermore, platform 208 is coupled with cantilever 212. As can be seen in FIG. 2, this particular figure displays sixteen cantilevers 212. Moreover, interconnect 204 is includes one or more interconnections that taken in combination are identified as interconnect 204.

Cantilevers 212 can be designed several different ways. One method is to manufacture the cantilevers 212 such that they have their own, independent directional control system. Thus, cantilevers 212 could be designed to be capable of moving along all three axises as defined by reference 299 (x-axis, y-axis, and z-axis). Such a design would require additional interconnections 204 in order to allow control signals to direct cantilevers 212.

Yet another cantilever 212 design is to make the cantilever 212 such that it does not require any independent stimulation to maintain contact with a desired target, or a passive cantilever 212. For instance, the cantilevers 212 are included in a MARE (Molecular Array Read/Write Engine), which is in turn connected with a platform 208 that is part of a cell. The cell can be moved along the Z-axis, as defined by reference 299, such that the cantilever 212 makes contact with a target platform. Cantilever 212 is then designed to have a curvature such that it curves away from the plane defined by platform 208. Thus, when looking at platform 208 from the side, cantilever 212 will protrude away from platform 208. Consequentially, as a target platform is positioned in close proximity to platform 208 and cantilever 212, the tip of cantilever 212 will make first contact with the target platform. Cantilever 212 can be designed such that it has a spring like response when pressure is placed upon the cantilever 212 tip. Hence, small changes in the distance between platform 208 and the target platform will not cause cantilever 212 from breaking contact with the target platform. The tip of cantilever 212 can then be positioned within the X/Y plane, as identified by reference 299 and defined by the target platform, through movement of platform 208 by the actuators (X-left actuator 222, Y-top actuator 226, X-right actuator 228, and Y-bottom actuator 232). Additionally, the relative X/Y location of the tip of cantilever 212 to the target platform can also be changed by movement of the target platform in the X/Y plane as defined by the target platform and as referenced by reference 299.

Another option is to make platform 208 so that it is spring loaded. Thus, cantilever 212, which is coupled with platform 208, contacts the target platform, both platform 208 and the target platform could move in the Z-direction. In this mode, fine probe tips (cantilever tips) are formed on cantilever 212 and arrayed around platform 208 to distribute the loading forces of platform 208 on the target platform. This reduces the amount of wear on both the fine probe tips and the target platform.

Yet another option is to place platform 208 inside a recessed cavity. This will provide additional space to permit the platform 208 to move in the Z-direction either through stimuli from the actuators or any spring loading incorporated into platform 208.

Figure 3:
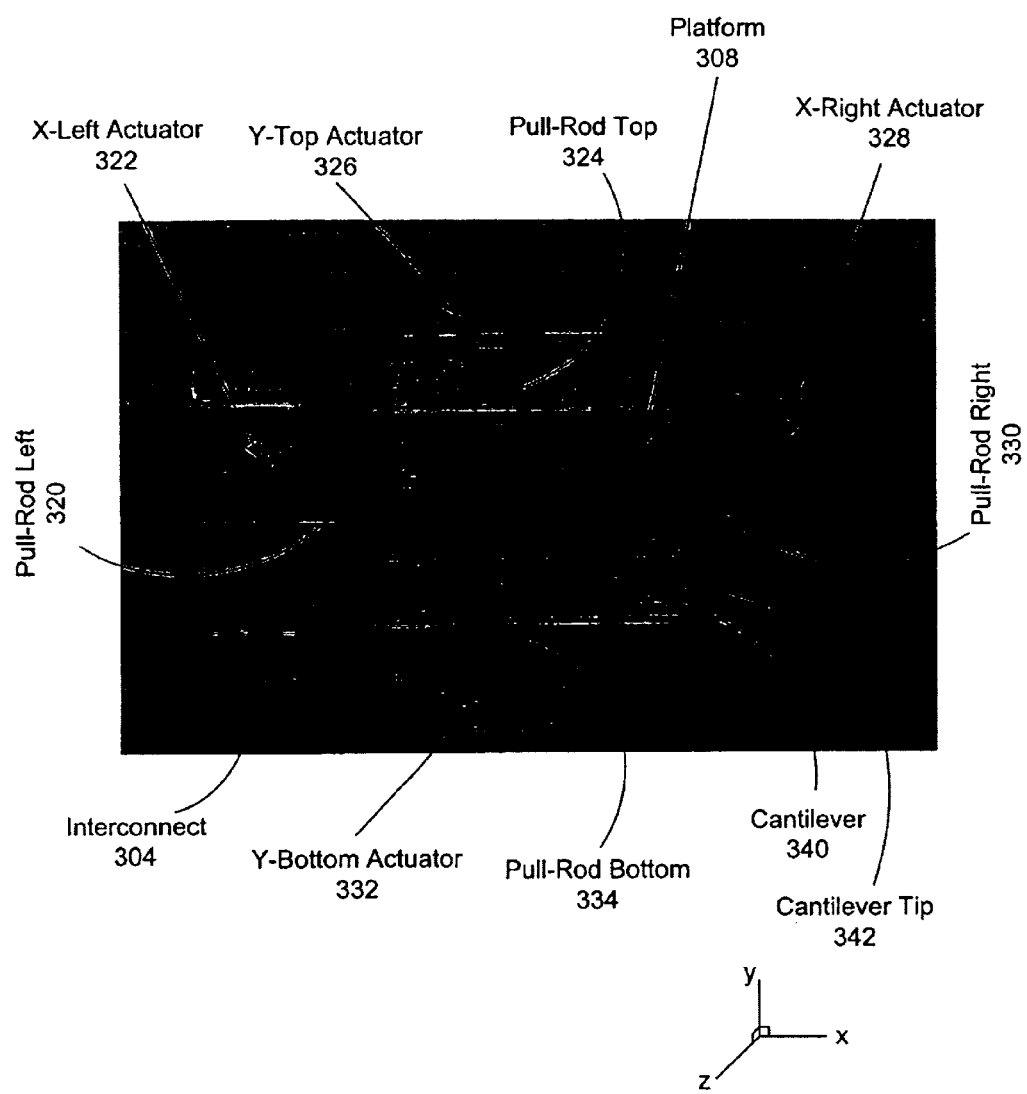
FIG. 3 is a scanning electron microscope picture of a cell of the embodiment of the invention of FIG. 1 including a MARE.

FIG. 3 is a scanning electron microscope picture of a cell 118 from FIG. 1. X-left actuator 322 is coupled with pull-rod left 320, which is in turn coupled with platform 308. Y-top actuator 326 is coupled with pull-rod top 324, which is in turn coupled with platform 308. X-right actuator 328 is coupled with pull-rod right 330, which is in turn coupled with platform 308. Y-bottom actuator 332 is coupled with pull-rod bottom 334, which is in turn coupled with platform 308. Interconnect 304 is coupled with platform 308. While not shown in complete detail, but following FIG. 1, interconnect 304 is also coupled with X-left actuator 322, Y-top actuator 326, X-right actuator 328 and Y-bottom actuator 332. Moreover, interconnect 304 is includes one or more interconnections that taken in combination are identified as interconnect 304. Also shown in FIG. 3. Is a MARE (Molecular Array Read/Write Engine) with sixteen cantilevers 340 each with a cantilever tip 342.

FIG. 3 shows how cantilever 340, which is coupled with platform 308, extends away from platform 308 in the Z-direction as defined by reference 399. At the end of cantilever 340 is a cantilever tip 342. Cantilever tip 342 is the point of contact with a target platform that is brought into close proximity with platform 308. For instance, if a memory device on a target platform is brought into close proximity to platform 308, eventually cantilever tip 342 will make contact with the memory device. For the cell shown in FIG. 3, since there are sixteen cantilevers 340, each with its own cantilever tip 342, there will be sixteen points of contact when the target platform is brought into contact with platform 308. Each cantilever 340 can handle a load force within reasonable limits. For instance, when a target platform makes contact with a cantilever tip 342, the cantilever 340 holds a contact load exerted by the target platform. As a consequence, cantilever 340 is designed to handle some deflection from its position with no load applied. Cantilever 340 is spring loaded such that as a force is applied to the cantilever tip 342, cantilever 340 applies a force back at the target platform, which is asserting the force which has caused cantilever 340 to move from its original position.

Consequentially, small movements along the Z-axis as defined by reference 399 will not cause the cantilever tip 342 to break contact with the target platform. Only when the target platform asserts no force against cantilever tip 342 can contact break between cantilever tip 342 and the target platform.

This design provides error control and durability to the design. Such a design could be adjusted to handle a wide range of error forces that could break contact between cantilever tip 342 and the target platform. The hardness of the cantilever tip, the hardness of the device on the target platform, and the friction coefficients of the two materials are several factors determining how much force the cantilever tip 342 can be subject to before the overall functionality of the micro-electronic mechanical system (MEMS) is impaired. For instance, in a MEMS device designed as a memory device such that the target platform holds a memory device that can be read and written to by the cantilever 340 through the cantilever tip 342, the cantilever tip 342 should be designed to minimize scratches, scars, deformities, etc., caused by cantilever tip 342 to the memory device. Likewise, the cantilever tip 342 must not be to soft as to be damaged by the memory device on the target platform.

Figure 4:
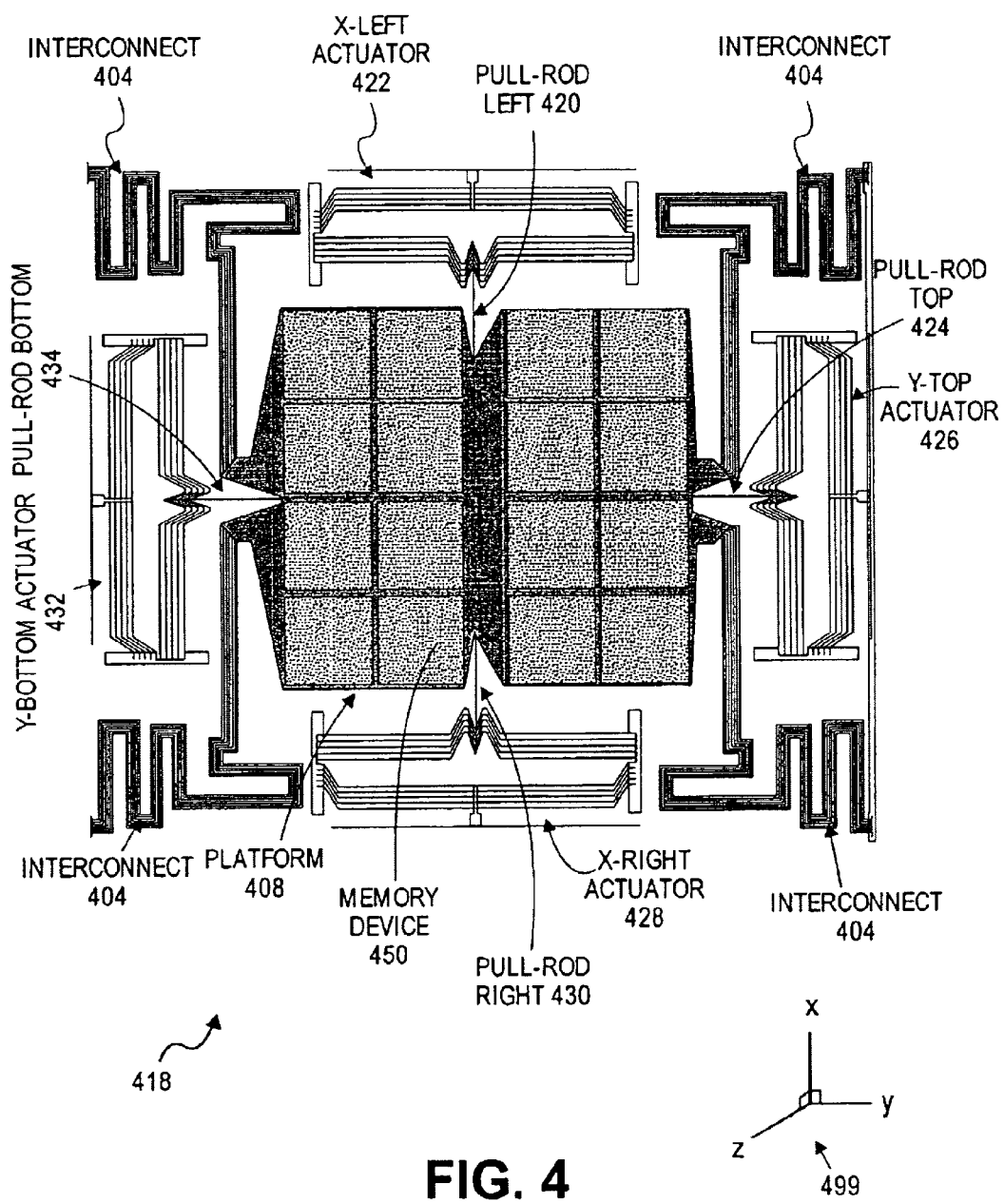
FIG. 4 is a cell of the embodiment of the invention that includes a memory devices.

FIG. 4 is a cell 418 that includes memory devices as opposed a MARE (Molecular Array Read/Write Engine) with cantilevers. X-left actuator 422 is coupled with pull-rod left 420, which is in turn coupled with platform 408. Y-top actuator 426 is coupled with pull-rod top 424, which is in turn coupled with platform 408. X-right actuator 428 is coupled with pull-rod right 430, which is in turn coupled with platform 408. Y-bottom actuator 432 is coupled with pull-rod bottom 434, which is in turn coupled with platform 408. Interconnect 404 is coupled with platform 408. While not shown in complete detail, but following FIG. 1, interconnect 404 is also coupled with X-left actuator 422, Y-top actuator 426, X-right actuator 428 and Y-bottom actuator 432. Moreover, interconnect 404 includes one or more interconnections that taken in combination are identified as interconnect 404. Additionally, memory devices 450 is coupled with platform 408. Shown in FIG. 4 are sixteen memory devices 450.

The actuators (X-left actuator 422, Y-top actuator 426, X-right actuator 428 and Y-bottom actuator 432) behave as described for the actuators of FIG. 2. Thus, as the actuators (X-left actuator 422, Y-top actuator 426, X-right actuator 428 and Y-bottom actuator 432) are activated, they exert a force along their corresponding pull-rod (pull-rod left 420, pull-rod top 424, pull-rod right 430, pull-rod bottom 434), respectively. Thus, platform 408 can be moved within the X-Y plane defined by platform 408 and referenced by reference 499. Furthermore, all of the actuators (X-left actuator 422, Y-top actuator 426, X-right actuator 428, and Y-bottom actuator 432) include the fault tolerant design discussed in FIG. 2.

FIG. 5a is a side view of a portion of a platform 508 holding a MARE (Molecular Array Read/Write Engine) 556 from a cell like cell 218 depicted in FIG. 2 positioned over a platform 554 from a cell like cell 418 depicted in FIG. 4 with a memory device 558. As can be seen, cantilever 540 has a curve, which causes cantilever 540 to extend along the Z-axis, as defined by reference 599. The furthest point from platform 508, but still coupled with platform 508, is cantilever tip 542. Cantilever tip 542 is the point that will contact the target device, in this case memory device 558, which is coupled with platform 554.

Figure 6:
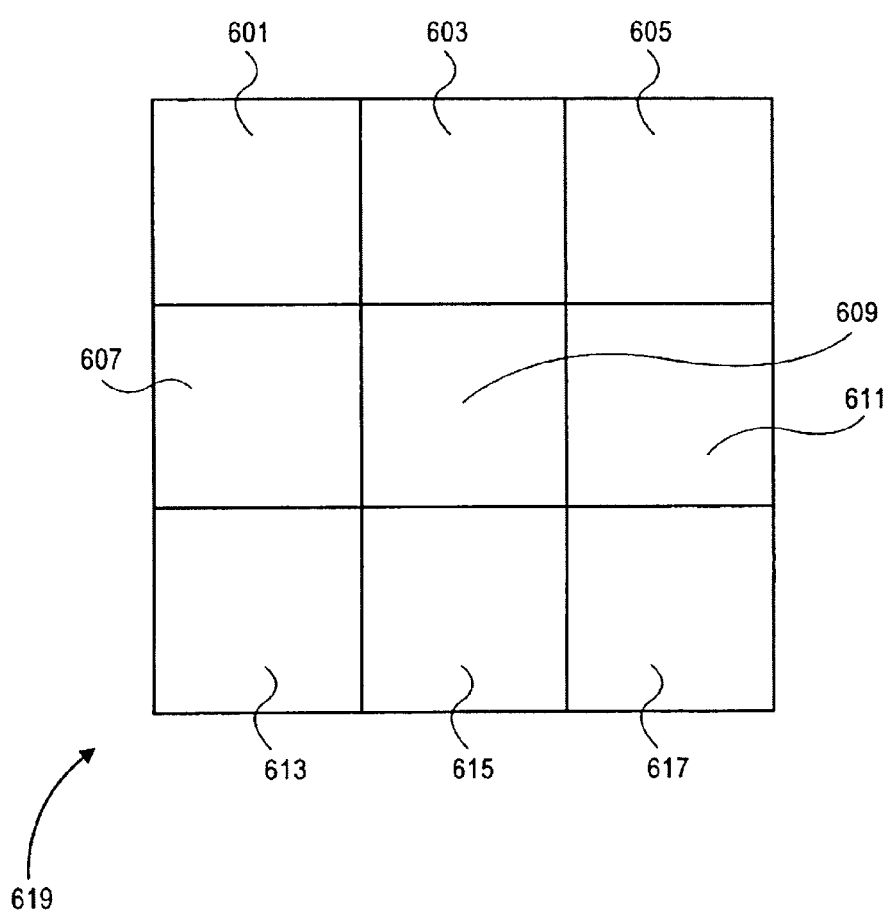
FIG. 6 is a gross positioning grid of an embodiment of the invention.

In operation, as shown in FIG. 5b, platform 508 and platform 554 are brought together such that the cantilever tip 542 of cantilever 540 comes in contact with memory device 558. In a typical memory access, a relatively large movement takes place such that the cantilever tip 542 is placed in one of nine quadrants relative to the memory device 558. For instance, in FIG. 6 is shown a top view of a memory device 619 which corresponds to memory device 558 in FIG. 5a and 5b. The memory device 619 is sectioned into nine sections: top left 601, top middle 603, top right 605, center left 607, center middle 609, center left 611, bottom left 613, bottom middle 615, and bottom right 617. Thus, for a memory access, cantilever tip 542 is first moved to one of the quadrants. For example, for a memory read someplace within the top right quadrant 601, cantilever tip 542 is positioned into the top right quadrant 601. This positioning can be performed in a number of different ways. For instance, platform 508 can be moved by way of actuators like those in FIG. 2. When platform 508 is moved, then the cantilever 540 that is coupled with platform 508, consequently, moves as well. Eventually, cantilever 540 will be positioned such that cantilever tip 542 will be within the top right quadrant 601. After gross positioning of cantilever tip 542, then fine positioning commences so an individual data bit can be read or written to by cantilever 540 through cantilever tip 542.

Another method is to move platform 554 by activation of actuators, such as those in FIG. 4, so that the memory device 558 is moved so as to bring the top right quadrant 601 to a position where cantilever tip 542 makes contact with the memory device 558 inside of top right quadrant 601. Yet another method is to move both platform 508 and platform 554 to bring cantilever tip 542 into the top right quadrant 601 of FIG. 6. Similar methods can be used for the remaining quadrants. Also, the memory device 558 could be broken into different formations. For instance, memory device 558 could be broken into three rectangular regions, three horizontal regions, one horizontal region and three smaller vertical regions for four total regions, etc. Again, after a gross positioning step, then fine movements are made to isolate a single data bit. Yet another method would be to skip the gross positioning step and rather make fine, precise movements to a particular location. Gross positioning and fine positioning can also proceed concurrently.

The foregoing description of the present invention have been presented for purposes of illustration and description. It is not intended to be exhaustive or to limit the invention to the precise forms disclosed. Obviously, many modifications and variations will be apparent to practitioners skilled in this art. The embodiments were chosen and described in order to best explain the principles of the invention and its practical application, thereby enabling others skilled in the art to understand the invention for various embodiments and with various modifications as are suited to the particular use contemplated. It is intended that the scope of the invention be defined by the following claims and their equivalents.

What is claimed is:

1. A memory apparatus, comprising:
   a media platform having a first substrate comprising silicon dioxide;
   a read/write mechanism, including:
      a read/write platform having a second substrate comprising silicon dioxide; and
      one or more cantilever tips connected with said read/write platform;
   a media platform movement mechanism operably attached to said media platform and configured to move said media platform in response to media control signals; and a read/write platform movement mechanism operably attached to said read/write platform and configured to move said read/write platform in response to read/write platform control signals;

wherein at least one of said one or more cantilever tips can cause the formation of an anomaly on said media platform.

2. The memory apparatus of claim 1, wherein the media platform and the read/write platform have substantially the same thermal expansion rates.

3. The memory apparatus of claim 1, whereby the media platform is read by applying a sensing signal through at least one of the one or more cantilever tips and into the media platform.

4. The memory apparatus of claim 1, whereby the media platform is written to by applying a write signal through at least one of the one or more cantilever tips and into the media platform.

5. A memory apparatus, comprising:

a media die having a plurality of media platforms;

a read/write die having a plurality of read/write mechanisms, each of the plurality of read/write mechanisms including:
a read/write platform comprising a material having a low thermal coefficient; and
one or more cantilever tips connected with said read/write platform;

a plurality of media platform movement mechanisms, each of the plurality of media platform movement mechanisms operably attached to a corresponding media platform and configured to move said media platform in response to media control signals; and a plurality of read/write platform movement mechanisms, each read/write movement mechanism operably attached to a corresponding read/write platform and configured to move said read/write platform in response to read/write platform control signals;

wherein at least one of said one or more cantilever tips can cause the formation of an anomaly on said media platform;

wherein each of the plurality of read/write mechanisms is sized such that the one or more cantilever tips can remain aligned with data previously written to the corresponding media platform across an operating temperature range.

6. The memory apparatus of claim 5, wherein each of the plurality of read/write mechanisms is adapted to be individually accessed; and wherein the material is silicon dioxide.

7. The memory apparatus of claim 5, whereby the memory die is read by applying a sensing signal through at least one of said one or more cantilever tips and into the media platform.

8. The memory apparatus of claim 5, whereby the memory die is written to by applying a write signal through at least one of said one or more cantilever tips and into the media platform.

9. The memory apparatus of claim 5, wherein each of the plurality of read/write mechanisms is adapted to be individually moved.

10. The memory apparatus of claim 5, wherein the plurality of read/write mechanisms are adapted to be multiplexed.

11. The memory apparatus of claim 5, wherein each of the cantilever tips can be individually accessed.

12. A memory apparatus, comprising:

a media cell having a plurality of media platforms;

a read/write cell having a plurality of read/write mechanisms, each of the plurality of read/write mechanisms including:
a read/write platform; and
one or more cantilever tips connected with said read/write platform;

a plurality of media platform movement mechanisms, each of the plurality of media platform movement mechanisms operably attached to a corresponding media platform and configured to move said media platform in response to media control signals; and a plurality of read/write platform movement mechanisms, each read/write movement mechanism operably attached to a corresponding read/write platform and configured to move said read/write platform in response to read/write platform control signals;

wherein each of said one or more cantilever tips can cause the formation of an anomaly on said media platform;

wherein each of the plurality of read/write mechanisms is sized such that the plurality of read/write mechanisms can operate across an industrial temperature range without thermal compensation.

13. The memory apparatus of claim 12, whereby the media cell is read by applying a sensing signal through at least one of the one or more cantilever tips and into the media platform.

14. The memory apparatus of claim 12, whereby the media cell is written to by applying a write signal through at least one of the one or more cantilever tips and into the media platform.

15. The memory apparatus of claim 12, wherein each of the plurality of read/write mechanisms is adapted to be individually accessed.

16. The memory apparatus of claim 12, wherein each of the plurality of read/write mechanisms is adapted to be individually moved.

17. The memory apparatus of claim 12, wherein the plurality of read/write mechanisms are adapted to be multiplexed.

18. The memory apparatus of claim 12, wherein each of the cantilever tips can be individually accessed.

19. An apparatus for use as cache memory in a computer system, comprising:

a media die having plurality of media platforms;

a read/write die having a plurality of read/write mechanisms, each of the plurality of read/write mechanisms including:
a read/write platform; and
one or more cantilever tips connected with said read/write platform;

a plurality of media platform movement mechanisms, each of the plurality of media platform movement mechanisms operably attached to a corresponding media platform and configured to move said media platform in response to media control signals; and a plurality of read/write platform movement mechanisms, each read/write movement mechanism operably attached to a corresponding read/write platform and configured to move said read/write platform in response to read/write platform control signals;

wherein at least one of said one or more cantilever tips can cause the formation of an anomaly on said media platform;

wherein the plurality of read/write mechanisms are adapted to be multiplexed.

20. The apparatus of claim 19, whereby the media platform is read by applying a sensing signal through at least one of the one or more cantilever tips and into the media platform.

21. The apparatus of claim 19, whereby the media platform is written to by applying a write signal through at least one of the one or more cantilever tips and into the media platform.

22. A computing system having improved power-up latency, comprising:
   a microprocessor;
   a hard disk drive electrically connected with the microprocessor;
   a cache memory device electrically connected with the microprocessor and the hard disk drive, the cache memory device including:
      a media die having plurality of media platforms;
      a read/write die having a plurality of read/write mechanisms, each of the plurality of read/write mechanisms including:
         a read/write platform; and
         one or more cantilever tips connected with said read/write platform;
      a plurality of media platform movement mechanisms, each of the plurality of media platform movement mechanisms operably attached to a corresponding media platform and configured to move said media platform in response to media control signals; and
      a plurality of read/write platform movement mechanisms, each read/write movement mechanism operably attached to a corresponding read/write platform and configured to move said read/write platform in response to read/write platform control signals;
      wherein at least one of said one or more cantilever tips can cause the formation of an anomaly on said media platform;
      wherein the plurality of read/write mechanisms are adapted to be multiplexed.

23. A server system, comprising:
   one or more microprocessors;
   one or more cache memory devices electrically connected with the one or more microprocessors, at least one of the cache memory devices including:
      a media die having plurality of media platforms;
      a read/write die having a plurality of read/write mechanisms, each of the plurality of read/write mechanisms including:
         a read/write platform; and
         one or more cantilever tips connected with said read/write platform;
      a plurality of media platform movement mechanisms, each of the plurality of media platform movement mechanisms operably attached to a corresponding media platform and configured to move said media platform in response to media control signals; and
      a plurality of read/write platform movement mechanisms, each read/write movement mechanism operably attached to a corresponding read/write platform and configured to move said read/write platform in response to read/write platform control signals;
      wherein at least one of said one or more cantilever tips can cause the formation of an anomaly on said media platform;
      wherein the plurality of read/write mechanisms are adapted to be multiplexed.

24. A memory apparatus, comprising:
   a media die having a plurality of media platforms;
   a read/write die having a plurality of read/write mechanisms, each of the plurality of read/write mechanisms including:
      a read/write platform; and
      one or more cantilever tips connected with said read/write platform;
   a plurality of media platform movement mechanisms, each of the plurality of media platform movement mechanisms operably attached to a corresponding media platform and configured to move said media platform in response to media control signals; and
   a plurality of read/write platform movement mechanisms, each read/write movement mechanism operably attached to a corresponding read/write platform and configured to move said read/write platform in response to read/write platform control signals;
   wherein at least one of said one or more cantilever tips can cause the formation of an anomaly on said media platform;
   wherein each of the plurality of read/write mechanisms is sized such that thermal expansion of the read/write platform across an operating temperature range does not cause misalignment of the one or more cantilever tips with data previously written to the corresponding media platform.

\* \* \* \* \*